United States Patent [19]

Itaya et al.

[11] Patent Number: 5,780,873
[45] Date of Patent: Jul. 14, 1998

[54] SEMICONDUCTOR DEVICE CAPABLE OF EASILY FORMING CAVITY AND ITS MANUFACTURING METHOD

[75] Inventors: Kazuhiko Itaya, Yokohama; Masahiro Yamamoto, Sagamihara; Masaaki Onomura; Hidetoshi Fujimoto, both of Kawasaki; Genichi Hatakoshi, Yokohama; Hideto Sugawara, Kawasaki; Masayuki Ishikawa, Yokohama; John Rennie, Tokyo; Shinji Saito, Yokohama, all of Japan

[73] Assignee: Kabushiki Kaisha Toshiba, Kawasaki, Japan

[21] Appl. No.: 689,689

[22] Filed: Aug. 13, 1996

[30] Foreign Application Priority Data

Sep. 1, 1995 [JP] Japan ................................. 7-225381
Feb. 26, 1996 [JP] Japan ................................. 8-038118

[51] Int. Cl.$^6$ ............................ H01L 33/00; H01L 29/04; H01L 31/036
[52] U.S. Cl. ........................ 257/521; 257/97; 257/103; 257/627
[58] Field of Search ..................... 257/95, 97, 103, 257/627

[56] References Cited

U.S. PATENT DOCUMENTS

| 4,734,576 | 3/1988 | Agoston et al. | 250/225 |
| 4,955,699 | 9/1990 | Singh et al. | 350/353 |
| 5,602,418 | 2/1997 | Imai et al. | 257/627 |
| 5,625,202 | 4/1997 | Chai | 257/94 |

OTHER PUBLICATIONS

R.K. Sink, et al., "Cleaved GaN Facets By Wafer Fusion of GaN To InP", Applied Physics Letter, 68 (15), Apr 8, 1996, pp 2147–2149.

Primary Examiner—Ngân V. Ngô
Attorney, Agent, or Firm—Oblon,Spivak,McClelland, Maier & Neustadt, P.C.

[57] ABSTRACT

A semiconductor light-emitting device comprises a semiconductor light-emitting device section of a hexagonal type; and an electrically conductive semiconductor substrate of a cubic type combined into the semiconductor light-emitting device, and having an orientation of its cleavage facet conformed to an orientation of the cleavage facet of one of semiconductor layers forming the semiconductor light-emitting device section. The substrate of the cubic type is cleaved so that the semiconductor light-emitting device section of the hexagonal type is induced to be cleaved, and that a mirror surface can be easily formed.

14 Claims, 4 Drawing Sheets

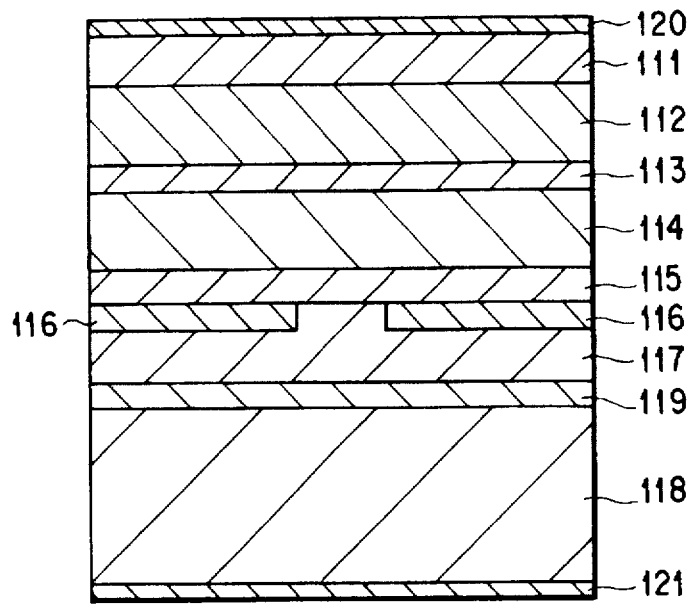
F I G. 6
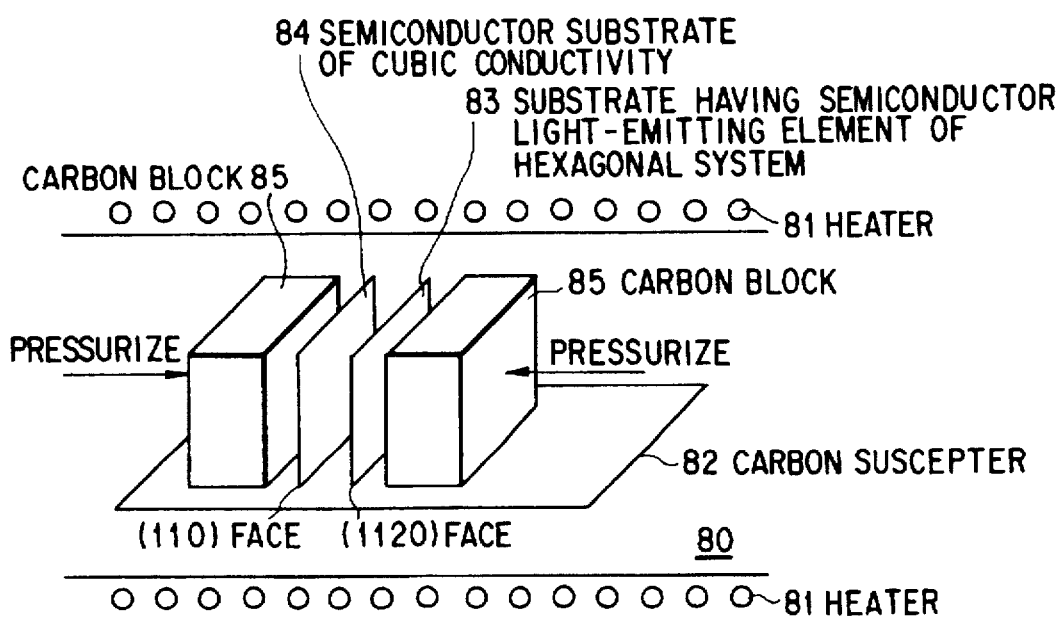
F I G. 7

SEMICONDUCTOR DEVICE CAPABLE OF EASILY FORMING CAVITY AND ITS MANUFACTURING METHOD

BACKGROUND OF THE INVENTION

1. Field of the Invention

The present invention relates to a semiconductor device using a compound semiconductor material and its manufacturing method and particularly to a semiconductor device comprising a compound semiconductor containing nitrogen such as CaN, AlGaN, InGaN, etc. and its manufacturing method.

2. Description of the Related Art

In recent years, the development of a semiconductor laser of a short wavelength is advanced to apply the laser onto an optical disk system having a high density. In the laser of this kind, it is required that a laser beam emission wavelength be shortened to enhance a recording density.

A light source of a 600 nm wavelength, which is formed of InGaAlP, is already put to practical use as a semiconductor laser having a short wavelength. This light source is improved to the extent that data can be read and written from/onto a disk. Then, a semiconductor laser for a blue color has been actively developed to more improve the recording density.

The operation of a semiconductor laser of a II–IV Group is already confirmed. However, there are many obstacles to make a practicable II–VI Group laser. For example, since the lasing operation is limited within one hour or so, reliability is not sufficient enough for practical use. Also, it is difficult for these semiconductor lasers to emit a laser beam having a wavelength of 480 nm or less. Thus, in view of the material, the semiconductor laser of this type has many limitations in applying onto an optical disk system as a next generation.

On the other hand, a semiconductor laser of GaN systems can emit a lasing wavelength shorter than 350 nm. Reliability of GaN systems have been confirmed through GaN LED, which, can operate for more than 10,000 hours. The material of nitride systems can satisfy requirements for the optical disk system for a next generation.

A mirror, serving as a cavity, is required indispensable to make semiconductor laser. In the general semiconductor laser, a mirror is formed using a cleaved facet. This makes use of the presence of a surface having small combined energy in a [011] or [01$\bar{1}$] direction in a zinc-blend structure.

The nitride series includes a cubic type and a hexagonal type. The hexagonal type growing on sapphire is now used to obtain LED of the nitride systems. However, in the hexagonal type, a mode for the cleaved facet, used in the general semiconductor laser, is not clearly present. Thus, it was extremely difficult to form the cavity mirror, and a yield of a device manufacturing process was low.

Moreover, since sapphire, no electrical conductivity was used as a substrate, it was impossible to flow a current to the device in a laminar direction. Instead, the current supply was forcibly made from a horizontal direction. As a result, a device resistance was greatly increased so as to exceed 50$\Omega$, it was difficult for the laser itself to operate. Even if the laser oscillated, the reliability of the device was considerably poor. Since a conventional current-blocking structure was not available, the degradation of the device was caused by applied voltage even if the laser oscillation was realized. Since the thermal conductivity of the sapphire substrate was poor, a crystal degradation was caused by heat generated when a high current, necessary for the laser oscillation, was supplied.

Even when the device was mounted on heat sink material, the degradation of the crystal was caused. Due to these problems, it was also extremely difficult to form a monolithic structure for realizing various colors.

In the conventional light-emitting device of the nitride systems, it was difficult to form the cavity mirror, and the device resistance was greatly high.

It was difficult for the laser to continuously oscillate. In the case of LED, the device resistance was greatly high.

SUMMARY OF THE INVENTION

An object of the present invention is to provide a semiconductor device, which is easily capable of forming a cavity mirror used in a semiconductor laser, etc., and its manufacturing method.

Another object of the present invention is to provide a semiconductor light-emitting device of a nitride systems having a sufficiently low device resistance and a high reliability, and its manufacturing method.

Further another object of the present invention is to provide a semiconductor light-emitting device, which is easily capable of forming a mirror and a current-blocking structure, and which has a sufficiently low device resistance, and a good integration, and its manufacturing method.

According to the first aspect of the present invention, there is provided a semiconductor device comprising a device section having a semiconductor of a hexagonal type; and a crystal section of a cubic type combined into the device section and to be cleaved.

In the above-structured semiconductor device, the device section is, for example, a semiconductor light-emitting device. As a semiconductor light-emitting device of a hexagonal type, for example, a semiconductor device of a nitride systems, which is grown on sapphire, can be considered.

In the hexagonal type semiconductor of the nitride systems a mode for a cleavage facet does not definitely exist. However, the crystal section of the cubic type and the device section are combined into each other. Therefore, the crystal section of the cubic type can be cleaved, so that a good mirror, which is a near natural cleaved facet, can be formed on the hexagonal device section.

In the semiconductor device in which the crystal section of the cubic type and the device section are combined into each other, for example, a laser cavity mirror can be easily formed.

According to the second aspect of the present invention, there is provided a semiconductor device comprising a device section having a semiconductor of a hexagonal type; and a crystal section combined into the device section, and the crystal section having a cubic type semiconductor substrate or semiconductor layer such that its [011]-orientation or [01$\bar{1}$]-orientation is conformed to an orientation determined by an integer notation of the hexagonal type semiconductor constituting the device section.

In the above-structured semiconductor device, the [011]-orientation of the crystal section or the [01$\bar{1}$]-orientation is conformed to the orientation determined by the integer notation of the hexagonal type semiconductor constituting the device section. Therefore, when the device section and the crystal section are bonded to each other to be combined into each other, the bonding due to the combination of atoms can be completely performed. Also, an electrical contact can be performed well at a boundary surface of the bonding.

According to the third aspect of the present invention, there is provided a semiconductor light-emitting device comprising a semiconductor light-emitting device section of a hexagonal type; and an electrically conductive semiconductor substrate of a cubic type combined into the semiconductor light-emitting device, and having an orientation of its cleavage facet conformed to an orientation of the cleavage facet of one of semiconductor layers forming the semiconductor light-emitting device section.

In the above-structured semiconductor light-emitting device, the hexagonal type semiconductor light-emitting device section, which is a light-emitting portion, is formed. Also, the cubic type conductive semiconductor substrate is formed to be combined into the hexagonal type semiconductor light-emitting device section.

The orientation of the cleavage facet of the conductive semiconductor substrate is conformed to that of the cleavage facet of one of semiconductor layers forming the semiconductor light-emitting device section.

Therefore, if the conductive semiconductor substrate of the cubic structure is cleaved, the semiconductor light-emitting device section is induced to be cleaved. Thereby, a good mirror, which is a near natural cleaved facet, can be formed on the hexagonal semiconductor light-emitting section.

According to the fourth aspect of the present invention, there is provided a method for manufacturing a semiconductor device comprising the steps of growing a device section comprising a semiconductor of a hexagonal type on a substrate; contacting the device section a semiconductor substrate of a cubic type separately prepared; and providing a process including at least a heating treatment so as to bond the device section to the semiconductor substrate.

In the above-mentioned manufacturing method, the device section and the semiconductor substrate are directly bonded to each other. Therefore, the semiconductor device, which corresponds to each of the above first to third aspects, or the semiconductor light-emitting device can be manufactured.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 6 is a cross sectional view showing an outline of a semiconductor laser device for a blue color of a fifth embodiment of the present invention;

FIG. 7 is a view showing a crystal bonding process of the semiconductor laser device;

DETAILED DESCRIPTION OF THE PREFERRED EMBODIMENTS

The outline of the present invention is as follows.

A cubic type semiconductor substrate is bonded to a light-emitting device of a nitride systems so as to form a cavity mirror by use of the cleavage of the cubic semiconductor substrate. Also, the cubic substrate is formed to include a light-emitting device layer having an electrical conductivity or a current-blocking structure. Thereby, a resistance and reliability laser can be improved.

A substrate, which is used to grow a light-emitting layer of a nitride series such as sapphire, is etched or polished to be removed. Also, an amorphous layer is formed between cubic type crystals, so that the cubic type semiconductor substrate is bonded to the light-emitting device without newly forming a crystal defectiveness.

According to the present invention, the semiconductor layer of the nitride systems having a hexagonal type is induced into a cleavage by the semiconductor substrate having the cubic type. Thereby, a good mirror, which is a near natural cleaved facet, can be formed. The cubic type semiconductor and the hexagonal light-emitting device are solid-reacted by thermal pressure at a boundary surface. Thereby, the amorphous layer having several atomic orders is formed, so that defectiveness generated by ununiformity of lattices can be prevented. In addition, the atoms are strongly combined with each other, and electrical contact resistance at the boundary surface of the bonding can be improved.

Also, a semiconductor layer for a red color and a semiconductor laser for a blue color, each having an inner current-blocking structure, are directly bonded to each other. Thereby, the light source of the conventional optical disk system and that of the optical disk system to be used in the near future can be integrated with each other. This can be easily applied to the optical disk system with a low cost.

The following will specifically explain each embodiment with reference to the drawings.

(First embodiment)

Figure 1:
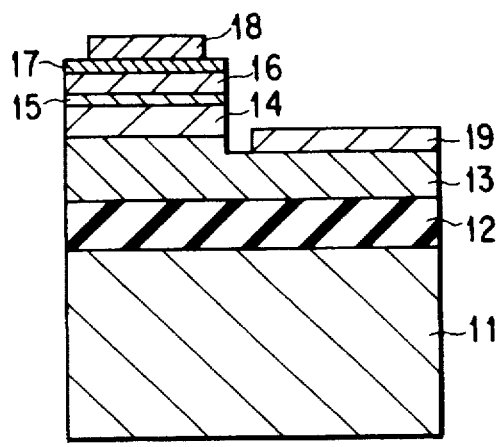
FIG. 1 is a cross sectional view showing an outline of a semiconductor laser device for a blue color of a first embodiment of the present invention.

FIG. 1 is a cross sectional view showing an outline of a semiconductor laser device for a blue color of a first embodiment of the present invention.

In the semiconductor laser device of this figure, a sapphire substrate 12 is formed to be directly bonded onto an InP substrate 11, serving as a crystal portion.

On the sapphire substrate 12, there are sequentially formed an n-GaN layer 13 (Si dope, 3 to $5\times10^{18}$ cm$^{-3}$), an a-Al$_{0.5}$Ga$_{0.5}$N clad layer 14 (Si dope, $5\times10^{17}$ cm$^{-3}$, thickness: 0.15 μm), a Gan active layer 15 (undope, thickness: 0.1 μm), a p-Al$_{0.5}$Ga$_{0.5}$N clad layer 16 (Mg dope, $5\times10^{17}$ cm$^{-3}$; thickness 0.15 μm), and a GaN contact layer 17 (Mg dope, 1 to $3\times10^{18}$ cm$^{-3}$, thickness: 0.1 μm) by crystal growth by MOCVD. The semiconductor layer portions on the sapphire substrate 12 are an example of the device section in the claims.

A GaN buffer layer (not shown), which is grown at low temperature of 550° C. by MOCVD, is formed between the n-GaN layer 13 and the sapphire substrate 12.

A p-side electrode 18 is formed on the GaN contact layer 17. An n-side electrode 19 is formed on a surface having no n-Al$_{0.5}$Ga$_{0.5}$N clad layer 14 is formed.

In the above-structured semiconductor laser device, the InP substrate of cubic type is directly bonded to a surface opposite to the growth surface. This bonding is performed after each crystal of hexagonal type is grown on the sapphire substrate 12 of hexagonal type or before the crystal growth.

At the direct bonding, the sapphire substrate 12 and the InP substrate 11 were pretreated with sulfate solution, cleaned with pure water, dried, and pressurized. Then, these substrates were annealed at temperature of 600° C. in a mixing atmosphere of nitrogen and hydrogen so as to be directly bonded to each other.

In this case, the natural cleaved facet direction [011] of the InP semiconductor substrate 11 and <11$\bar{2}$0>-orientation of the sapphire substrate were set to be conformed to each other. The sapphire substrate was polished up to have a thickness of 40 μm, and the thickness of the InP substrate was 50 μm.

The crystal growth portion including the sapphire substrate 12 and the InP substrate 11 were combined with each other. Thereafter, the combined structure was cleaved to form a mirror as a cavity.

The above structure was easily cleaved along the natural cleaved facet direction [011] of the InP substrate 11, and the mirror surface having a good cleaved facet was formed. This is because the sapphire substrate 12 and the InP substrate 11 are bonded to each other with high strength by combining the atoms with each other. Moreover, it can be considered that the crystal surface of hexagonal type is induced into a cleavage due to a driving force resulting from the definite natural cleavage of the zincblend-structure of the InP substrate 11.

An oscillating operation of the above-structured semiconductor laser device will be explained as follows.

The laser device of this embodiment continuously oscillated by the threshold value of 150 mA at room temperature. In this case, the oscillation wavelength was 365 nm, and the operation voltage was 10V. In this laser device, the device resistance was not particularly improved. However, since the InP substrate 11 can be easily mounted on a copper-made heat sink, and improvement of heat resistance was confirmed.

According to the first embodiment, the InP substrate 11 is directly bonded to the sapphire substrate 12. Then, the laser oscillation section, serving as the device section of the hexagonal type layered on the sapphire substrate 12, is induced into a cleavage due to a driving force resulting from the definite cleavage of the zincblend-structure of the InP substrate 11. Thereby, the cavity mirror to be required in the semiconductor laser can be easily formed.

Moreover, the cleaved facet direction [011] of the InP semiconductor substrate 11 and <11$\bar{2}$0>-orientation of the sapphire substrate 12 are set to be conformed to each other. Due to this, the device section and the crystal section are bonded to each other with high strength by combining the atoms with each other. Also, the cleavage mode of the hexagonal type can be well induced. Also, electrical contact at the bonding boundary surface can be improved.

Even if the cleaved facet direction [01$\bar{1}$] of the InP semiconductor substrate 11 and <11$\bar{2}$0>-orientation of the sapphire substrate 12 are set to be conformed to each other, a good mirror surface can be formed by the induction into a cleavage in the same manner as the above-mentioned case.

Since the InP substrate 11 is a substrate, which can be directly bonded to the other substrate easily, the bonding and the induction into a cleavage can be surely performed.

(Second embodiment)

Figure 2:
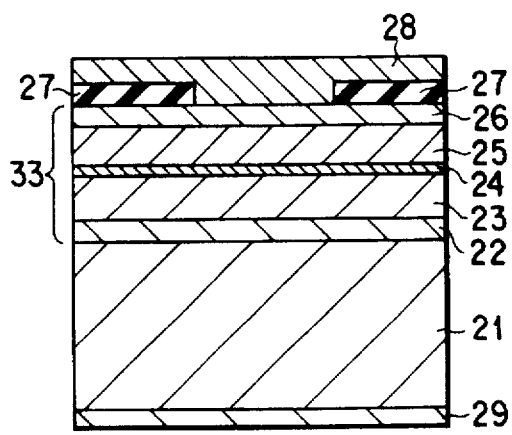
FIG. 2 is a cross sectional view showing an outline of a semiconductor laser device for a blue color of a second embodiment of the present invention.

FIG. 2 is a cross sectional view showing an outline of a semiconductor laser device for a blue color of a second embodiment of the present invention.

In the semiconductor laser device of this figure, on an n-InP substrate 21, serving as a crystal section, there are sequentially formed an n-GaN layer 22 (Si dope, 3 to $5\times10^{18}$ cm$^{-3}$), an n-Al$_{0.5}$Ga$_{0.5}$N clad layer 23 (Si dope, $5\times10^{17}$ cm$^{-3}$, thickness: 0.2 μm), In$_{0.1}$Ga$_{0.9}$N active layer 24 (undope, thickness: 200 Å), a p-Al$_{0.5}$Ga$_{0.5}$N clad layer 25 (Mg dope, $5\times10^{17}$ cm$^{-3}$, thickness 0.2 μm), and a GaN contact layer 26 (Mg dope, 1 to $3\times10^{18}$ cm$^{-3}$, thickness: 0.1 μm).

A double heterostructure 33, which comprises n-GaN layer 22, n-Al$_{0.5}$Ga$_{0.5}$N clad layer 23, In$_{0.1}$Ga$_{0.9}$N active layer 24, p-Al$_{0.5}$Ga$_{0.5}$N clad layer 25, and GaN contact layer 26, is formed on the sapphire substrate of hexagonal type by crystal growth by MOCVD. Therefore, the double heterostructure 33 is the hexagonal type.

The n-GaN layer 22 in the double heterostructure 33 is directly bonded to the n-InP substrate 21 of the cubic type.

In the semiconductor layer device, a current-blocking layer 27 is formed on the GaN contact layer 26. The current-blocking layer 27 is made of SiO$_2$, and stripe-shaped, and has an opening. A p-side electrode 28 is formed to directly contact the GaN contact layer 26 through the opening. An n-side electrode 29 is formed on the lower side of the n-InP substrate 21, which is opposite to a surface where the n-GaN layer 22 is bonded.

Figure 3A:
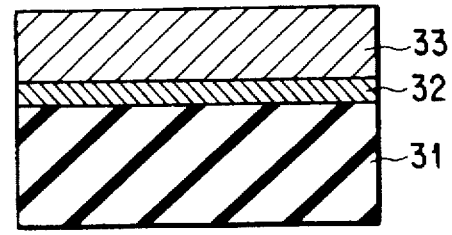
FIG. 3A is a view explaining a method for manufacturing the semiconductor device of the second embodiment of the present invention.
Figure 3B:
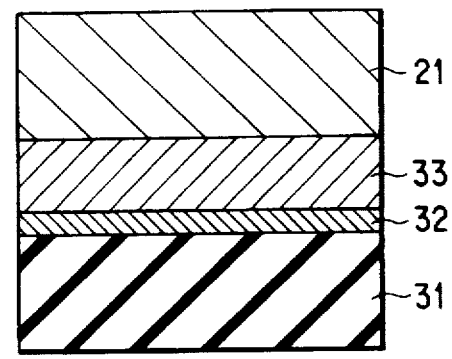
FIG. 3B is a view explaining a method for manufacturing the semiconductor device of the second embodiment of the present invention.
Figure 3C:
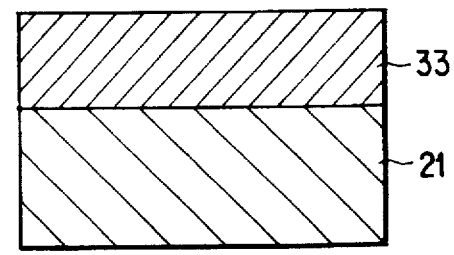
FIG. 3C is a view explaining a method for manufacturing the semiconductor device of the second embodiment of the present invention.

The following will explain a method of manufacturing the above structure with reference to FIGS. 3A to 3C.

FIG. 3A shows an outline of an epitaxial growth layer of a nitride series by MOCVD.

An AlN buffer layer 32 (undope, thickness: 200 Å) is grown on a sapphire substrate 31. The double heterostructure including the active layer 24 is also grown thereon.

After the crystal growth, the nitride epitaxial growth layer is directly bonded to the substrate as shown in FIG. 3B. The substrate used in this case is the n-InP substrate 21. Then, the surface to which the double heterostructure 33 is bonded is the n-GaN layer 22. The double heterostructure 33 and the n-InP substrate 21 were pretreated with sulfate solution, cleaned with pure water, dried, and pressurized. Then, they were annealed at temperature of 600° C. in a mixing atmosphere of nitrogen and hydrogen so as to be directly bonded to each other.

At the direct bonding, the cleaved facet direction [011] of the n-InP substrate 21 and <11$\bar{1}$0>-orientation of the nitride epitaxial growth layer were set to be conformed to each other. The n-InP substrate 21 was polished up to have a thickness of 90 μm.

After bonding, if the double heterostructure 33 and the n-InP substrate 21 are set in phosphoric acid heated at 200° C., the AlN buffer layer 32 is etched from a horizontal direction. Then, the entire sapphire substrate 31 is lifted off to be removed from the heterostructure 33. Thereby, there can be formed the structure in which the nitride epitaxial growth layer is directly mounted on the InP substrate 21 as shown in FIG. 3C.

After the double heterostructure 33 and the n-InP substrate 21 were combined with each other, and the combined structure was cleaved to form a cavity mirror. Thereby, a good mirror surface was formed by the induction into a cleavage in the same manner as the first embodiment.

Moreover, $SiO_2$ is deposited and etched, and electrodes are formed on the etched portion, so that the structure shown in FIG. 2 is completed. It is noted that FIGS. 3A and 3B are displayed by turning FIGS. 3C and 2 upside down, respectively.

The oscillating operation of the above-structured semiconductor laser device will be explained as follows.

The laser device of this embodiment continuously oscillated at temperature of up to 50° C. by the threshold value of 75 mA. The oscillation wavelength was 395 nm, and the operation voltage was 8V. In this laser device, particularly, the device resistance was improved. The current-supply from the horizontal direction increased the device resistance as in the first embodiment. However, in the second embodiment, it can be considered that the current-supply to the substrate direction can greatly improve the device resistance.

According to the second embodiment, the sapphire substrate 31 is lifted off to be removed from the double heterostructure after growing the structure 33 serving as the device of the hexagonal type. Then, the n-InP substrate 11 is directly bonded to the double heterostructure 33. Thereby, the cavity mirror to be required in the semiconductor laser can be easily formed by the induction into a cleavage in the same manner as the first embodiment.

Moreover, the natural cleaved facet direction [011] of the n-InP substrate 21 and <11$\bar{2}$0>-orientation of the double heterostructure are set to be conformed to each other. Due to this, the device section and the crystal section are bonded to each other with high strength by combining the atoms with each other. Also, the cleavage mode of the hexagonal type can be well induced, and electrical contact at the bonding boundary surface can be improved.

Even if the natural cleaved facet direction [01$\bar{1}$] of the InP semiconductor substrate 11 and <11$\bar{2}$0>-orientation of the double heterostructure are set to be conformed to each other, a good mirror surface can be formed by the induction into a cleavage in the same manner as the above-mentioned case.

Moreover, the electrodes are formed on the lower surface of the n-InP substrate 11 so that the current can flow in a laminar direction. As a result, increase in the device resistance can be prevented. Also, the device structure is simplified so that reliability can be improved. There can be manufactured a semiconductor device having a low device resistance and an easy laser oscillation. In other words, the substrate having a high resistance such as sapphire can be removed, so that the current can be supplied to the semiconductor laminar direction. Therefore, there can be provided a semiconductor device having a sufficiently low device resistance and a high reliability and its manufacturing method.

The above embodiment explained the case of the laser device. However, the present invention is not limited to the laser device. For example, even in the case of LED, there can be provided the semiconductor device having a low resistance and a high reliability.

(Third embodiment)

Figure 4:
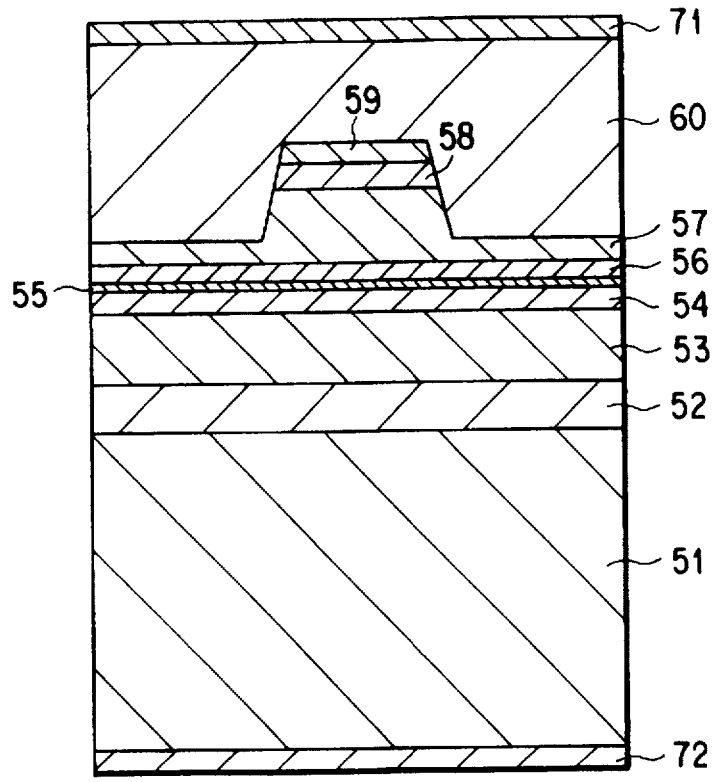
FIG. 4 is a cross sectional view showing an outline of a semiconductor laser device for a blue color of a third embodiment of the present invention.

FIG. 4 is a cross sectional view showing an outline of a semiconductor laser device for a blue color of a third embodiment of the present invention.

In the semiconductor laser device of this figure, on a GaP substrate 51, serving as a crystal portion, there are sequentially formed an n-GaN layer 52 (Si dope, 3 to $5 \times 10^{18}$ cm$^{-3}$), an n-$Al_{0.5}Ga_{0.5}N$ clad layer 53 (Si dope, $5 \times 10^{17}$ cm$^{-3}$, thickness: 0.3 μm), a GaN guiding layer 54 (undope, thickness: 0.1 μm), a $In_{0.1}Ga_{0.9}N$ active layer 55 (undope, thickness: 100 Å), a GaN guiding layer 56 (undope, thickness: 0.1 μm), a p-$Al_{0.5}Ga_{0.5}N$ clad layer 57 (Mg dope, $5 \times 10^{17}$ cm$^{-3}$, thickness: 0.3 μm), a GaN contact layer 58 (Mg dope, 1 to $3 \times 10^{18}$ cm$^{-3}$, thickness: 0.1 μm), an InN contact layer 59 (Mg dope, 1 to $3 \times 10^{18}$ cm$^{-3}$, thickness: 100 Å), a GaP contact layer 60 (Mg dope, 1 to $3 \times 10^{18}$ cm$^{-3}$, thickness: 1.5 μm), and a p-side electrode 71. An n-side electrode 72 is formed on the lower side of the GaP substrate 51, which is opposite to a surface where the n-GaN layer 52 is bonded.

Similar to the second embodiment, the crystal growth on the sapphire substrate of hexagonal type is performed by MOCVD.

In this crystal growth, an AlN layer, serving as a buffer layer, is formed. Then, the double heterostructure, serving as a device portion, is formed. The double heterostructure includes InN contact layer 59, GaN contact layer 58, p-$Al_{0.5}Ga_{0.5}N$ clad layer 57, GaN guiding layer 56, $In_{0.1}Ga_{0.9}N$ active layer 55, GaN guiding layer 54, n-$Al_{0.5}Ga_{0.5}N$ clad layer 53, and n-GaN layer 52 in order.

Similar to the above-mentioned embodiment, the GaP substrate 51 and the N-GAN layer are directly bonded to each other after growing the double heterostructure. Then, the AlN layer is etched and lifted off from the horizontal direction. As a result, the sapphire substrate used at the time of growing the double can be removed.

Thereafter, in this embodiment, a second crystal growth is performed to form a contact layer.

The double heterostructure is the hexagonal type grown on the sapphire substrate. Then, a ridge was formed on the portions of InN contact layer 59, GaN contact layer 58, p-$Al_{0.5}Ga_{0.5}N$ clad layer 57 as shown in FIG. 4. Thereafter, the GaP contact layer 60 of cubic type was grown again by MOCVD.

At the time of growing the GaP contact layer 60 again, a thin GaP layer (thickness: 200 Å, not shown) was grown at low temperature (500° C.). Then, the temperature was increase to 800° C. so that the GaP layer was grown to have a thickness of 1.5 μm. Thereby, the cubic type contact layer having a noncrystalline property and low resistance was formed.

Thereafter, electrodes are formed, and the structure shown in FIG. 4 is completed.

The oscillating operation of the above-structured semiconductor laser device will be explained as follows.

The laser device of this embodiment continuously oscillated at temperature of up to 80° C. by the threshold value of 45 mA. The oscillation wavelength was 395 nm, and the operation voltage was 4V. The device oscillates in a basic horizontal mode, and the stable operation for 5000 hours was confirmed. The InN contact layer 59 was inserted to relax the influence of heteospikes generated based on a large band gap between the GaN layer 58 and the GaP layer 60. As compared with the case having no InN contact layer 59, reduction of 3V or more voltages was realized.

In addition to the same structure and manufacturing method as the second embodiment, in the third embodiment, the ridge and the GaP contact layer 60 are formed. As a result, the good convergence of oscillation light and the low resistance can be obtained in addition to the same advantages as the first embodiment.

Since the GaP substrate 51 absorbs only small amounts of light from an wavelength area for a blue color, the efficiency of oscillation light can be improved.

Similar to the previous embodiments, in the third embodiment, the <11$\bar{2}$0>-orientation of the GaP substrate 51 of the double heterostructure and the cleaved facet direction [011] or [01$\bar{1}$] are conformed to each other. Then, the double heterostructure is induced into a cleavage by the GaP substrate 51.

According to the manufacturing method of this embodiment, a low temperature growing layer is once formed on the portions of InN contact layer 59, GaN contact layer 58, p-$Al_{0.5}Ga_{0.5}N$ clad layer 57. As a result, GaP contact layer 60 of cubic type can be grown by MOCVD. Therefore, in place of GaP substrate 51, for example, GaP contact layer 60 can be used as a crystal portion for an induction into a cleavage. In this case, the semiconductor device may be manufactured without using a direct bonding method. Specifically, the semiconductor of hexagonal type is grown on the substrate. Sequentially or after the growth, some process is executed so as to grow the cubic type semiconductor.

(Fourth embodiment)

Figure 5:
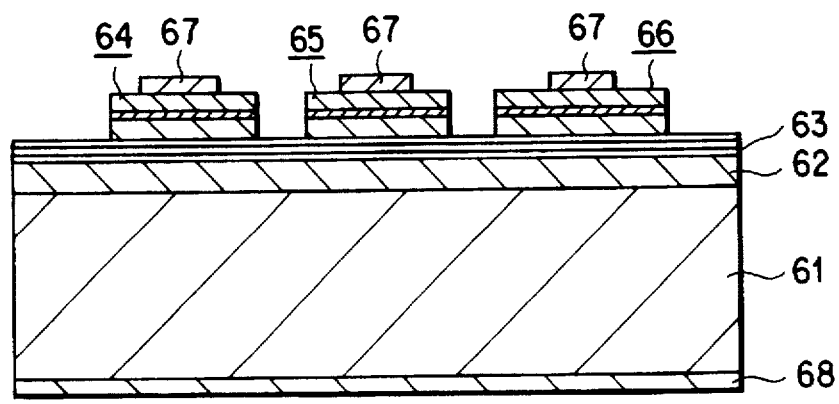
FIG. 5 is a cross sectional view showing an outline of a semiconductor laser device for a blue color of a fourth embodiment of the present invention.

FIG. 5 is a cross sectional view showing an outline of a semiconductor laser device for a multicolor of a fourth embodiment of the present invention.

In the semiconductor laser device for a multicolor, a GaN layer 62 (undope) is formed on an InP substrate 61, and a Bragg reflector having five pairs of AlN and GaN is formed thereon. Moreover, a blue laser section 64, a yellow laser section 65, and a red laser section 66 are formed on the Bragg reflector.

A p-side electrode is formed on each of the laser sections 64, 65, and 66. An n-side electrode 68 is formed on the lower surface of the InP substrate 61, which is opposite to these laser devices.

It is noted that the InP substrate 61 and the GaN layer 62 are directly bonded to each other after the GaN layer 62 is grown on the sapphire substrate as explained in the previous embodiment.

The Bragg reflector comprises 5 pairs of AlN and GaN. The InP substrate 61 and GaN layer 62 are directly bonded to each other. Thereafter, the Bragg reflector is crystal-grown thereon by MOCVD. Since the upper surface layer is an n-GaN layer (Si dope, $5\times10^{18}$ $cm^{-3}$), the upper surface layer can be used as a contact layer. The reflexible wavelength area of the Bragg reflector 63 was adjusted to substantially a green from a blue.

The blue laser section 64 is formed of a double heterostructure having an InGaN active layer. The blue layer section 64 is continuously crystal-grown on the Bragg reflector 63 by MOCVD. The mirror surface of the blue laser section 64 is formed by the induction into a cleavage using the InP substrate 61.

The yellow laser section 65 is formed of a double heterostructure having an InGaAlP active layer. The double heterostructure grown by MOCVD is processed to be chip-formed. Thereafter, similar to the other embodiments, the yellow laser section 65 is directly bonded to the Bragg reflector 63.

The red laser section 66 is formed of a double heterostructure having an InGaP active layer. The red layer section 66 is formed in the same manner as the yellow laser section 65.

According to the semiconductor laser device for a multicolor of this embodiment, the blue laser can be realized by the same structure and manufacturing method as explained in the previous embodiments. In addition, the yellow laser section 65 and the red laser section 66 are directly bonded to each other so as to be combined with the blue laser section 64. As a result, the specifications for substantially all colors can be realized in addition to the same advantages as explained in the previous embodiments. Since the light source section is monolithically formed, molding and optical design can be easily carried out.

This embodiment explained the case of the semiconductor laser device for a multicolor. However, the respective laser sections can be replaced with light-emitting sections for LED so as to form an LED light source for a multicolor.

In the case of the LED light source for a multicolor, the induction into a cleavage is not needed. As a result, the sapphire substrate is used for InP substrate 61, the n-GaN layer, which is formed on the top of the Bragg-reflector, may be used as a contact layer. Then, the n-side electrodes are arranged on the uppermost surface of the Bragg-reflector to surround the respective chips in a stripe form. In this case, the blue LED section can be continuously grown on the sapphire substrate.

In such an LED light source for a multicolor, the specifications for all colors can be realized by the threshold value of 20 mA. Also, there can be obtained the device having the device resistance, which is sufficiently low against any light-emitting device, and high reliability.

(Fifth embodiment)

FIG. 6 is a cross sectional view showing an outline of a semiconductor laser device for a blue color of a fifth embodiment of the present invention.

In the semiconductor laser device of this figure, there are sequentially formed an n-GaN contact layer 111 (Si dope, $5\times10^{18}$ $cm^{-1}$, 1 μ), an n-$Al_{0.2}Ga_{0.8}N$ clad layer 112 (Si dope, $5\times10^{17}$ $cm^{-3}$, thickness: 0.3 μm), an active layer 113 having an $In_{0.5}Ga_{0.9}N$ quantum well (undope, thickness: 5 nm) a GaN barrier layer (undope, thickness: 10 nm), a p-$Al_{0.2}Ga_{0.8}N$ clad layer 114 (Mg dope, $5\times10^{17}$ $cm^{-3}$, thickness: 0.3 μm), a p-GaN clad layer 115 (Mg dope, $5\times10^{18}$ $cm^{-3}$, thickness: 0.2 μm), an n-GaN current prohibition layer 116 (Si dope, $5\times10^{18}$ $cm^{-3}$, thickness: 0.5 μm), and a p-GaN contact layer 117 (Mg dope, $5\times10^{18}$ $cm^{-3}$, thickness: 0.2 μm). Moreover, a p-GaAs substrate 118, an amorphous layer 119 (thickness: 10 nm), an n-side electrode 120, and a p-side electrode 121 are formed.

In this figure, the n-GaN contact layer 111, which is a hexagonal structured crystal, to the p-GaN contact layer 117 are grown on the sapphire substrate by MOCVD twice.

The semiconductor layer, which includes the n-GaN contact layer 111 to the n-GaN current prohibition layer 116, is crystal-grown on the sapphire substrate. Thereafter, the n-GaN current prohibition layer 116 is etched in a direction perpendicular to <11$\bar{2}$0>-orientation with a width of 10 μm in a stripe form. As a result, the p-GaN clad layer 115 is exposed. Then, the p-GaN contact layer 117 is grown thereon again.

The surface of the p-GaN contact layer 117 is polished as a mirror surface. Then, the <11$\bar{2}$0>-orientation of the P-GaN contact layer 117 is detected by X-ray diffraction, etc. The p-GaN contact layer 117 is cut at the detected surface.

The substrate, which includes device sections 111 to 117 whose faces are detected, and the substrate having the p-GaAs mirror surface substrate 118 are bonded to each other as shown in FIG. 7. In this case, the p-GaAs mirror surface substrate 118 is separately prepared and its <011>-orientation is detected in advance.

FIG. 7 is a view showing a crystal bonding process in the semiconductor laser device.

In a nitrogen atmospheric furnace 80 having a heater 81, on a carbon suscepter 82, a substrate 83 and substrate 84 are bonded to each other by pressing carbon blocks 85. The substrate 83 has a hexagonal semiconductor light-emitting device comprising the device sections 111 to 117. The substrate 84 is the cubic conductive semiconductor device, which is the p-GaAs mirror surface substrate 118.

The (11$\bar{2}$0)-face of the substrate 83 and the (110)-face of the substrate 84 are positioned to be opposite to the carbon suscepter 82.

The <11$\bar{2}$0>-orientation of the substrate 83 and the <011>-end surface of the (001) p-GaAs mirror surface substrate 118/84 are contacted each other along the carbon suscepter 82 horizontally. Then, they are pressurized to be bonded to each other at 700° C., so that an amorphous layer 119 having a thickness of about 10 nm is formed at the boundary surface shown in FIG. 6.

Then, the sapphire layer is removed from the resultant substrate by polishing or dry-etching, etc. As a result, the n-GaN contact layer 111 is exposed, and the p-GaAs substrate 118 is polished up to have a thickness of 80 μm as a mirror surface.

An n-side electrode 120 and a p-side electrode 121 are formed on the surface of the n-GaN contact layer 111 and that of the p-GaAs substrate 118, respectively.

The resultant wafer (substrate) is cleaved against <011> of the GaAs semiconductor substrate. The resultant end surface of the hexagonal crystal was formed to be flat with a thickness of 5 nm or less by induction due to the driving force of the cleavage of the GaAs substrate.

The oscillating operation of the above-structured semiconductor laser device will be explained as follows.

The laser device of this embodiment continuously oscillated at room temperature by the threshold value of 70 mA. The oscillation wavelength was 420 nm, and the operation voltage was 4V. The lifetime of the device was 5000 hours at 50° C. with 30 mW.

According to this embodiment, the orientations of the cleavage facets of the device sections 111 to 117 and the orientation of the cleavage facet of the p-GaAs substrate 118 are conformed to each other. The resultant wafer (substrate) is cleaved against <011> of the GaAs semiconductor substrate. In this case, the device sections 111 to 117 constitute the semiconductor light-emitting device structure section having the hexagonal structure. Also, the p-GaAs substrate 118 constitutes the conductive semiconductor substrate having the cubic structure. The resultant wafer (substrate) is cleaved against <011> of the GaAs semiconductor substrate 118. As a result, the resultant end surface of the hexagonal crystal can be formed to be flat.

Thereby, there can be easily obtained the semiconductor laser device for a blue color having a good oscillation characteristic.

In the above-mentioned semiconductor laser device and its manufacturing method, the amorphous layer 119 is formed between the device sections 111 to 117 and the p-GaAs substrate 118. In this case, the amorphous layer 119 comprises GaN, which contains elements for both structures, and GaAs. The GaN layer and the GaAs layer, each having a different crystal structure and a different lattice constant, are brought in contact each other. At this time, the structural atoms are stably combined with each other by forming the amorphous layer due to the solid-phase reaction. Therefore, no crystal defectiveness is generated so that degradation can be prevented. In addition, the contact area can be increased, a good radiation can be obtained, and a contact resistance can be reduced.

Also, the sapphire substrate having no conductivity is completely removed, so that the current can be supplied in a vertical direction. As a result, there can be obtained an assembly having a good radiation.

Accordingly, in this embodiment, the mirror and the current block structure can be easily formed. In addition, series resistance can be reduced. As a result, the device resistance can be fully decreased, and reliability can be improved. Moreover, there can be obtained a semiconductor light-emitting device of nitride having a good integration. Also, its manufacturing can be realized.

(Sixth embodiment)

Figure 8:
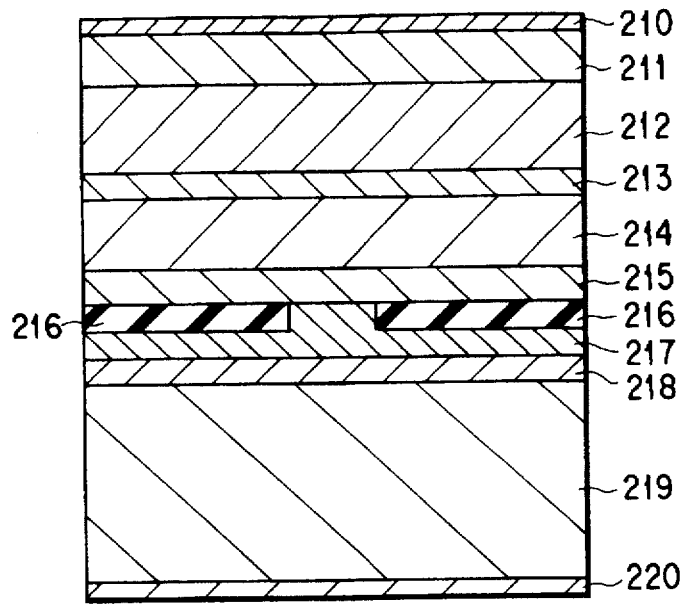
FIG. 8 is a cross sectional view showing an outline of a semiconductor laser device for a blue color of a sixth embodiment of the present invention.

FIG. 8 is a cross sectional view showing an outline of a semiconductor laser device for a blue color of a sixth embodiment of the present invention.

In the semiconductor laser device of this figure, there are sequentially formed an n-GaN contact layer 211 (Si dope, $5\times10^{18}$ cm$^{-3}$, 1 μm), an n-Al$_{0.2}$G$_{0.8}$N clad layer 212 (Si dope, $5\times10^{17}$ cm$^{-3}$, thickness: 0.3 μm), an active layer 213 having an In$_{0.1}$Ga$_{0.9}$N quantum well (undope, thickness: 5 nm) a GaN barrier layer (undope, thickness: 10 nm), a p-Al$_{0.2}$Ga$_{0.8}$N clad layer 214 (Mg dope, $5\times10^{17}$ cm$^{-3}$, thickness: 0.3 μm), a p-GaN contact layer 215 (Mg dope, $5\times10^{18}$ cm$^{-3}$, thickness: 0.2 μm), an SiO$_2$ insulation film 216, an Ni/Au electrode 217, an AuZn/Au ohmic electrode 218, and a p-GaAs substrate 219. Moreover, an n-side electrode 210 and a p-side electrode 220 are formed thereon.

In this figure, the hexagonal-structured crystals 211 to 215 are grown on the sapphire substrate by one MOCVD. Thereafter, the SiO$_2$ insulation film 216 is etched in a direction perpendicular to <11$\bar{2}$0>-orientation of the p-GaN contact layer 215 with a width of 10 μm in a stripe form. As a result, the Ni/Au electrode 217 is formed. Thereafter, the AuZn/Au ohmic electrode 218 is formed by deposition.

The above-obtained substrate, which includes the semiconductor light-emitting deice structure, and the p-GaAs mirror surface structure 219 are bonded to each other as shown in FIG. 7, similar to the case of the fifth embodiment.

Specifically, <11$\bar{2}$0>-orientation of the substrate and <111>-orientation of the p-GaAs mirror surface substrate 219 are conformed to each other and pressurized at 500° C. under the nitrogen atmosphere to so as to be bonded to each other. Then, the sapphire layer is removed from the bonded substrate taken out of the nitrogen atmosphere furnace 80 by polishing or dry-etching. As a result, the n-GaN contact layer 211 is exposed, and the p-GaAs substrate 219 is polished up to have a thickness of 80 μm as a mirror surface.

The n-side electrode 210 and the p-side electrode 220 are formed on the surface of the n-GaN contact layer 211 and that of the p-GaAs substrate 219, respectively. The resultant wafer (substrate) is cleaved against <011> of the GaAs semiconductor substrate. As a result, the resultant end surface of the hexagonal crystal can be formed to be flat with a thickness of 8 nm or less by induction due to the driving force of the cleavage of the GaAs substrate 219.

The oscillating operation of the above-structured semiconductor laser device will be explained as follows.

The laser device of this embodiment continuously oscillated at room temperature by the threshold value of 120 mA. The oscillation wavelength was 420 nm, and the operation voltage was 8V. The lifetime of the device was 2000 hours at 50° C. with 30 mW.

In this embodiment, the GaN layer and the GaAs layer, each having a different crystal structure and a different lattice constant, are brought in contact each other through a metal. As a result, in addition to the same advantages as the case of the fifth embodiment, the following advantages can be obtained.

Specifically, the propagation of the crystal defectiveness can be prevented, the device degradation can be prevented, and a good radiation can be obtained.

(Seventh embodiment)

Figure 9:
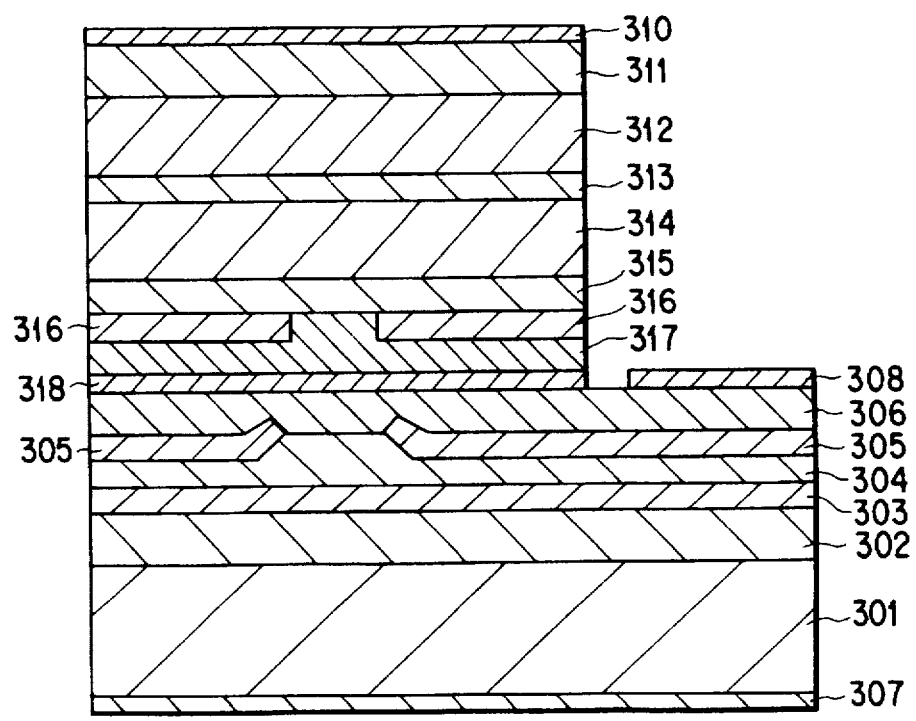
FIG. 9 is a cross sectional view showing an outline of a semiconductor laser device of a seventh embodiment of the present invention in which a semiconductor laser for a blue color and a semiconductor laser for a red color are integrated with each other.

FIG. 9 is a cross sectional view showing an outline of a semiconductor laser device of a seventh embodiment of the present invention in which a semiconductor laser for a blue color and a semiconductor laser for a red color are integrated with each other.

In the figure, as a semiconductor laser section for a blue color, there are sequentially formed an n-side electrode 310 for a blue element, an n-GaN contact layer 311 (Si dope, $5 \times 10^{18}$ cm$^{-3}$, thickness: 1 μm), an n-Al$_{0.2}$Ga$_{0.8}$N clad layer 312 (Si dope, $5 \times 10^{17}$ cm$^{-3}$, thickness: 0.3 μm), an active layer 313 having an In$_{0.1}$Ga$_{0.9}$N quantum well (undope, thickness: 5 nm) and a GaN barrier layer (undope, thickness 10 nm), a p-Al$_{0.2}$Ga$_{0.8}$N clad layer 314 (Mg dope, $5 \times 10^{17}$ cm$^{-3}$, thickness: 0.3 μm), a p-GaN clad layer 315 (Mg dope, $5 \times 10^{18}$ cm$^{-3}$, thickness: 0.2 μm), an n-Gan current prohibition layer 316 (Si dope, $5 \times 10^{18}$ cm$^{-3}$, thickness: 0.5 μm), and a p-GaN contact layer 317 (Mg dope, $5 \times 10^{18}$ cm$^{-3}$, thickness: 0.2 μm). As a semiconductor laser section for a red color, on an n-GaAs substrate 301, there are sequentially formed an n-InGaAlP clad layer 302, a quantum well active layer 303, a p-InGaAlP clad layer 304, an n-GaAs current prohibition layer 305, and a p-GaAs contact layer 306. Then, the p-GaN contact layer 317 and the p-GaAs contact layer 306 are bonded to each other through an amorphous layer 318. Moreover, in this semiconductor laser device, an n-side electrode 307 for a red color and a p-side common electrode 308 are formed.

In this figure, similar to the fifth embodiment, the hexagonal-structured crystals 311 to 317 are grown on the sapphire substrate twice by MOCVD. The surface of the p-GaN contact layer 317 is polished as a mirror surface.

In this figure, the cubic-structured crystals 302 to 306 are grown on the n-GaAs substrate three times by MOCVD. The surface of the p-GaAs contact layer 306 is polished as a mirror surface.

Similar to the fifth embodiment, <11$\bar{2}$0>-orientation of the substrate of the laser section for a blue color and <011>-orientation of the laser section for a red color are vertically set to face the carbon suscepter 82 of the nitrogen atmospheric furnace 80. Both surfaces are contacted each other such that cavity strips are superimposed on each other.

Then, they are pressurized at 700° C. so as to be bonded to each other. Thereby, an amorphous layer 318 having a thickness of about 10 nm is formed at the boundary surface.

The sapphire layer is removed from the bonded substrate taken out of the nitrogen atmospheric furnace 80 by polishing or dry-etching. As a result, the n-GaN contact layer 311 is exposed, and the n-GaAs substrate 301 is polished up to have a thickness of 80 μm as a mirror surface.

The n-side electrode 310 and the n-side electrode 307 are formed on the surface of the n-GaN contact layer 311 and that of the n-GaAs substrate 301, respectively. Finally, the laser device sections 310 to 317 and the part of the amorphous layer 318 are removed by polishing or dry-etching so as to form the common p-side electrode 308.

The resultant wafer (substrate) is cleaved against <011> of the GaAs semiconductor substrate. As a result, the resultant end surfaces of both semiconductor lasers for a blue color and a red color can be simultaneously obtained. In this case, they are formed to flat with a thickness of 5 nm or less by induction due to the driving force of the cleavage of the GaAs substrate.

In this embodiment, there were obtained the semiconductor laser for a blue color having the threshold current 70 mA, the oscillation waveform of 420 nm, the operation voltage of 4V, and the semiconductor laser for a red color having the threshold current 30 mA, the oscillation waveform of 650 nm, the operation voltage of 2.4V. Then, there was no degradation due to the integration.

According to this embodiment, the cleavage orientation of the substrate of the laser section for a blue color and that of the laser section for a red color are conformed to each other. Then, they are bonded to each other so as to form the amorphous layer 318 on the bonded surface. Also, there can be formed a good mirror surface by the induction into the cleavage. Therefore, in addition to the same advantages as the fifth embodiment, an integrated laser device, which serves as a multicolor light source, can be easily manufactured. In other words, there can be obtained a laser device for combining a red light source for a conventional optical disk into a blue light source for an optical disk for a next generation.

According to the integrated laser device of this embodiment, the compatibility of the system can be easily established. Particularly, since the packaging for a laser beam source and the alignment of the optical system can be used in common, the manufacturing cost and the size of the device can be easily reduced.

The above-explained structure of each of the embodiments can be manufactured by the simple process with a good reproductivity, and its usefulness is greatly high.

The present invention is not limited to the above-mentioned embodiments. The present invention can be variously modified without deviating from the gist of the invention.

For example, SiC can be used as a semiconductor layer having a hexagonal type. The compound semiconductor of other III-V Group, the compound semiconductor of a II-VI Group, Si, Ge, etc may be used a semiconductor layer having a cubic type. Moreover, the hexagonal type may be mixed with the part of the cubic type of the grown layer. The present invention can be applied to the case of the opposite conductivity. Moreover, the present invention can be applied to the electronic device, such as a light-receiving device, a transistor, etc, and the combination of such electronic devices.

As shown in the sixth embodiment, the structure of the active layer of each embodiment includes the quantum well structure.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A semiconductor device comprising:
   a device section having a semiconductor of a hexagonal type; and
   a crystal section of a cubic type combined into the device section and to be cleaved.

2. The semiconductor device according to claim 1, wherein said device section is a semiconductor light-emitting device having a compound semiconductor containing nitrogen.

3. A semiconductor device comprising:
   a device section having a semiconductor of a hexagonal type; and
   a crystal section combined into said device section, and said crystal section having a cubic type semiconductor substrate or semiconductor layer such that its [011]-orientation or [01$\bar{1}$]-orientation is conformed to an orientation determined by an integer notation of the hexagonal type semiconductor constituting said device section.

4. The semiconductor device according to claim 3, wherein the orientation determined by the integer notation of the hexagonal type semiconductor is a <11$\bar{2}$0>-orientation.

5. The semiconductor device according to claim 3, wherein said device section is a semiconductor light-emitting device having a compound semiconductor containing nitrogen.

6. A semiconductor light-emitting device comprising:
   a semiconductor light-emitting device section of a hexagonal type; and
   an electrically conductive semiconductor substrate of a cubic type combined into said semiconductor light-emitting device, and having an orientation of its cleavage facet conformed to an orientation of the cleavage facet of one of semiconductor layers forming said semiconductor light-emitting device section.

7. The semiconductor light-emitting device according to claim 6, wherein at least a metallic layer or an oxide layer is formed between said semiconductor light-emitting device section and said conductive semiconductor substrate.

8. The semiconductor light-emitting device according to claim 7, wherein said semiconductor light-emitting device section comprises a compound semiconductor containing nitrogen, and has a mirror surface induced and cleaved by cleaving said conductive semiconductor substrate.

9. The semiconductor light-emitting device according to claim 8, wherein a second semiconductor light-emitting device section capable of emitting a red laser beam is formed between said semiconductor light-emitting device section and said conductive semiconductor substrate.

10. The semiconductor light-emitting device according to claim 6, wherein said semiconductor light-emitting device section and said conductive semiconductor substrate are directly contacted each other.

11. The semiconductor light-emitting device according to claim 6, wherein an amorphous layer having structural elements for said semiconductor light-emitting section and said conductive semiconductor substrate is formed between said semiconductor light-emitting section and said conductive semiconductor substrate.

12. The semiconductor light-emitting device according to claim 11, wherein said amorphous layer is formed by directly bonding said semiconductor light-emitting section and said conductive semiconductor substrate to each other.

13. The semiconductor light-emitting device according to claim 12, wherein said semiconductor light-emitting device section comprises a compound semiconductor containing nitrogen, and has a mirror surface induced and cleaved by cleaving said conductive semiconductor substrate.

14. The semiconductor light-emitting device according to claim 6, wherein a second semiconductor light-emitting device section capable of emitting a red laser beam is formed between said semiconductor light-emitting device section and said conductive semiconductor substrate.

* * * * *